(12) United States Patent
Feldkeller et al.

(10) Patent No.: US 10,883,776 B2
(45) Date of Patent: Jan. 5, 2021

(54) LINER TUBE FOR THE INLET CHANNEL OF A PLATE HEAT EXCHANGER

(71) Applicant: Mahle International GmbH, Stuttgart (DE)

(72) Inventors: Timo Feldkeller, Asperg (DE); Dominik Behnert, Leonberg (DE)

(73) Assignee: Mahle International GmbH

( * ) Notice: Subject to any disclaimer, the term of this patent is extended or adjusted under 35 U.S.C. 154(b) by 97 days.

(21) Appl. No.: 16/028,375

(22) Filed: Jul. 5, 2018

(65) Prior Publication Data

US 2019/0011198 A1 Jan. 10, 2019

(30) Foreign Application Priority Data

Jul. 6, 2017 (DE) .................. 10 2017 211 529

(51) Int. Cl.
  *F28D 1/03* (2006.01)
  *F28F 9/02* (2006.01)
  (Continued)

(52) U.S. Cl.
  CPC .......... *F28F 9/0273* (2013.01); *F28D 1/0375* (2013.01); *F28F 9/0246* (2013.01); *F28F 9/0265* (2013.01); *F28F 9/0278* (2013.01); *G03F 7/70925* (2013.01); *F28D 1/03* (2013.01); *F28D 2021/008* (2013.01); *F28D 2021/0028* (2013.01); *F28D 2021/0043* (2013.01); *F28F 2009/224* (2013.01); *H01M 8/04067* (2013.01); *H01M 10/625* (2015.04);
  (Continued)

(58) Field of Classification Search
  CPC .. F28D 1/03; F28D 1/0375; F28D 2021/0028; F28D 2021/0043; F28D 2021/008; F28F 2009/224; F28F 9/0246; F28F 9/0265; F28F 9/0273; F28F 9/0278; H01M 10/625; H01M 10/65; H01M 10/663; H01M 2220/20; H01M 2250/20; H01M 8/04067
  See application file for complete search history.

(56) References Cited

U.S. PATENT DOCUMENTS 2,098,830 A    11/1937  McElgin
3,622,393 A *  11/1971  Sherwood ............. H01M 2/145
                                              264/216
(Continued)

FOREIGN PATENT DOCUMENTS

DE   10 2005 021 787 A1   11/2006
DE      102011008653 A1    7/2012
(Continued)

OTHER PUBLICATIONS

English abstract for JP-2003-161 547.

*Primary Examiner* — Filip Zec
(74) *Attorney, Agent, or Firm* — Fishman Stewart PLLC

(57) ABSTRACT

A liner tube for an inlet channel of a plate heat exchanger may include an open front side for supplying a refrigerant mass flow, an at least partially closed rear side, and at least two bag-like chambers running in a longitudinal direction of the liner tube. Each chamber may communicate with the open front side, and may have openings at chamber-dependent different positions for distributing the refrigerant mass flow in plate stacks of the plate heat exchanger.

17 Claims, 2 Drawing Sheets

(51) Int. Cl.
    *G03F 7/20* (2006.01)
    *H01M 10/625* (2014.01)
    *H01M 10/663* (2014.01)
    *F28D 21/00* (2006.01)
    *F28F 9/22* (2006.01)
    *H01M 10/65* (2014.01)
    *H01M 8/04007* (2016.01)

(52) U.S. Cl.
    CPC .......... *H01M 10/65* (2015.04); *H01M 10/663* (2015.04); *H01M 2220/20* (2013.01); *H01M 2250/20* (2013.01)

(56) References Cited

U.S. PATENT DOCUMENTS

| | | | | |
|---|---|---|---|---|
| 8,806,883 | B2* | 8/2014 | Burk | F25B 17/086 62/324.6 |
| 9,093,729 | B2 | 7/2015 | Wesner et al. | |
| 9,696,097 | B2* | 7/2017 | Bera | F28F 3/12 |
| 10,001,325 | B2* | 6/2018 | Bergh | F28D 1/0316 |
| 2006/0254310 | A1 | 11/2006 | Kamsma | |
| 2011/0203308 | A1* | 8/2011 | Chiang | F25B 39/028 62/498 |
| 2015/0000327 | A1* | 1/2015 | Kakehashi | F25D 17/02 62/434 |
| 2015/0168075 | A1* | 6/2015 | Bertilsson | B21J 5/066 165/166 |
| 2017/0234587 | A1* | 8/2017 | Jindou | F28F 9/02 62/527 |
| 2018/0231323 | A1* | 8/2018 | Riebel | F16H 57/04 |
| 2019/0348699 | A1* | 11/2019 | Reytier | H01M 8/04089 |

FOREIGN PATENT DOCUMENTS

| | | | |
|---|---|---|---|
| EP | 2 242 963 B1 | 9/2015 | |
| GB | 949378 A | * 2/1964 | .......... B01J 19/0013 |
| JP | 2003-161 547 A | 6/2003 | |

\* cited by examiner

LINER TUBE FOR THE INLET CHANNEL OF A PLATE HEAT EXCHANGER

CROSS-REFERENCE TO RELATED APPLICATIONS

This application claims priority to German Patent Application No. DE 10 2017 211 529.7, filed on Jul. 6, 2017, the contents of which are incorporated herein by reference in its entirety.

TECHNICAL FIELD

The present invention relates to a liner tube for the inlet channel of a plate heat exchanger. The invention also relates to a plate heat exchanger comprising such a liner tube, as well as to a use of such a plate heat exchanger for temperature regulation.

BACKGROUND

Plate (disk) heat exchangers (transfer units), which discharge heat from the coolant into evaporating refrigerant, so-called chillers, are more and more widespread in the field of the thermal management of electric and fuel cell vehicles. In particular the rapid charging, in response to which large amounts of heat are created within a short time, poses major challenges on the chiller. Large chillers, which have a plurality of plates, are required for this case. A refrigerant two-phase mixture has to be distributed across these plates, that is, the portion of the gas phase to the liquid phase should ideally be identical (in height) at every plate. However, if the vehicle drives in the so-called coasting mode, only a very low waste heat is still present. The chiller then runs at very low load, the refrigerant mass flow drops and a different distribution of the two-phase mixture than in the case of the rapid charging or in the case of full load, respectively, is created. It is thus not possible to apply the same gas/liquid portions of the refrigerant to the plurality of plates for every mode of operation.

The problem is currently solved via so-called S-flow chillers comprising dip tube. The refrigerant is not only sent through the chiller in the plate direction therein and escapes on the other plate side, but is deflected on the outlet side in the height (transversely to the plate plane), is returned into disk plane again, is then deflected once again in the height, and is guided across the plates to the outlet one last time. The refrigerant two-phase mixture thus does not need to be divided across many plates. The dip tube serves the purpose of maintaining the inlet and outlet side on the upper component side, which provides an advantage with regard to installation space. In addition, the refrigerant distribution in the plane can be optimized by means of corresponding injection bores. The coolant is unaffected by this.

European patent specification EP 2 242 963 B1 discloses a heat exchanger comprising a short and a long distributor tube, which are arranged in the inlet manifold thereof. The distributor tubes have openings for distributing a fluid in different directions.

The U.S. Pat. No. 2,098,830 also discloses a heat exchanger comprising distributor tubes, which are arranged in the main tube thereof. The distributor tubes have openings at different locations inside the main tube.

Published Japanese patent application JP 2003 3 161 547 A discloses a plate heat exchanger comprising inlet-side distributor disks, and the published German patent application DE 10 2011 008 653 A1 discloses a heat exchanger comprising meander-shaped fluid guide.

In all of these solutions, the cross section, which is flown through, is reduced, the running length and the number of the deflections for the refrigerant mass flow is increased. All of this has a negative effect on the refrigerant-side pressure drop and thus on the specific output of the chiller. The pressure drop is thereby created in the heat exchanger block and thus effects the performance of the chiller. This represents a significant disadvantage in particular in the case of plate heat exchangers of large dimensions.

SUMMARY

According to the invention, this problem is solved by the subject matters of the independent claims. Advantageous embodiments are the subject matter of the dependent claims.

The present invention is based on the general idea of ensuring the division of a refrigerant two-phase mixture even without deflection and the associated pressure loss in the heat exchanger block. This is to be made possible at least approximately in the case of the common refrigerant mass flows in response to partial and full load. A liner tube according to the invention is provided for this purpose, which can be inserted into the refrigerant inlet channel of the chiller. The liner tube is thereby divided into at least two bag-like chambers, which run in the longitudinal direction of the liner tube and into which the refrigerant can flow via an open front side of the liner tube. The rear side of the liner tube is closed or at least partially closed. Openings, which serve as outlets for the supplied refrigerant, are located in the wall of the liner tube. Said openings are attached at different chamber-dependent positions to distribute the refrigerant two-phase mixture in plate stacks of the plate heat exchanger. The division of the liner tube into chambers thereby provides for a particularly even distribution of the refrigerant two-phase mixture across the plate stacks of the heat exchanger, which significantly improves the efficiency of the plate heat exchanger independent of the mass flow. The liner tube thereby does not necessarily need to have a round cross section, but can also be designed with an elliptical or a polygonal cross section, dependent on demand.

In an advantageous further development of the solution according to the invention, the at least two chambers are formed by secant partition walls, which run longitudinally in the liner tube, which, on the one hand, allows for an optimal use of the entire cubic content thereof and thus a refrigerant guiding, which is as resistance-free as possible, and which, on the other hand, allows for a particularly simple production of the individual chambers.

In a further advantageous further development of the solution according to the invention, the openings are embodied in a slit-shaped manner and are in particular formed for selectively guiding a flow. First of all, this provides for an efficient distribution of the refrigerant two-phase mixture across several plates. It goes without saying that the openings can also be designed so as to be round, dependent on demand.

In a further advantageous further development of the solution according to the invention, at least one of the chambers has at least one drainage opening for discharging oil, so as to cope with the risk that the oil accumulates in one of the chambers. The at least one drainage opening is thereby advantageously arranged on the otherwise closed rear side of the liner tube, so as to ensure a safe oil outlet. It is particularly preferred thereby when a drainage opening communicates with more than one of the chambers. The number of the drainage openings can thus be reduced and the producibility of the liner tube can be simplified.

In a further advantageous further development of the solution according to the invention, the liner tube is made of an extrusion material. The liner tube can be produced by means of a particular cost-efficient extrusion process in this case.

In a further advantageous further development of the solution according to the invention, the rear side of the liner tube is pinch-sealed, which also requires only a cost-efficient process. Should the closed side of the liner tube be pinched mechanically, a drainage opening, such as an oil outlet opening, for example, could also be made possible simultaneously in response to the pinching.

The present invention is also based on the general idea of providing a refrigerant-side division of the plates into plate packs, which significantly reduces the likelihood of a maldistribution of the two-phase mixture, because the mixture does not longer need to be distributed across a large distance. In the case of the plate heat exchanger according to the invention, the above-described liner tube is thus arranged in an inlet channel of the plate heat exchanger in such a way that respective openings of the liner tube for distributing a supplied refrigerant two-phase mixture are oriented in respective plate stacks of the plate heat exchanger. The opening of a chamber thereby extends across a certain number of adjacent plates, thus a plate pack. The openings of the other chambers extend across further adjacent plates and form a further plate pack. Each plate is thus assigned to its own plate pack, which is supplied with refrigerant by a chamber of the liner tube. Due to the fact that such liners are components used in chillers, they can be handled in the chiller in a process-safe manner. A very large test effort to determine the best configuration, such as for example in the case of the embossing of the dip tube, is not necessary. The pressure drop in the liner tube additionally does not have an impact on the heat exchanger block, but participates in the intended expansion of the refrigerant prior to the evaporation process.

In a further advantageous further development of the solution according to the invention, the inlet channel of the plate heat exchanger has a flange section, which is designed to align the supplied refrigerant mass flow in the longitudinal direction of the chambers. This is so, because if the inflow in the flange section or chiller inlet tube is guided in the longitudinal direction of the chambers, thus in the plane of the secant partition walls, a particularly good distribution of the refrigerant two-phase mixture independent of the mass flow results.

In a preferred use, the plate heat exchanger according to the invention is to be used to regulate the temperature of electric and/or fuel cell vehicles, because large amounts of heat, which need to be handled, are in particular created there within a short period of time.

Further important features and advantages of the invention follow from the subclaims, from the drawings, and from the corresponding figure description by means of the drawings.

It goes without saying that the above-mentioned features and the features, which will be described below, cannot only be used in the respective specified combination, but also in other combinations, or alone, without leaving the scope of the present invention.

Preferred exemplary embodiments of the invention are illustrated in the drawings and will be described in more detail in the description below, whereby identical reference numerals refer to identical or similar or functionally identical components.

BRIEF DESCRIPTION OF THE DRAWINGS

In each case schematically

DETAILED DESCRIPTION

Figure 1:
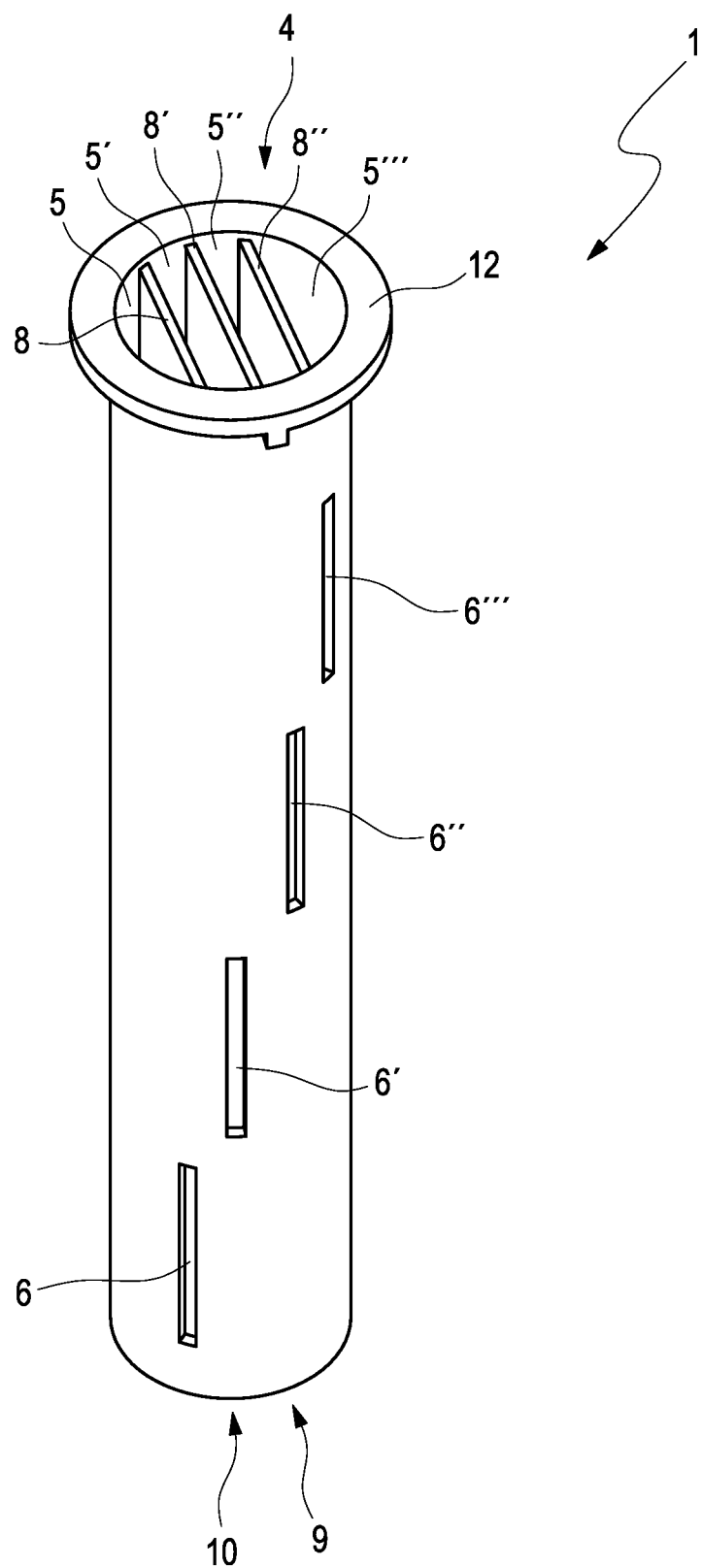
FIG. 1 shows a perspective view of a liner tube according to the invention from above at an angle onto its front side.

FIG. 1 shows a perspective view of a liner tube 1 according to the invention, with view from above at an angle onto its front open side 4. The interior of the liner tube 1 is divided across its length into a total of four chambers 5, 5', 5" and 5'" by means of three secant partition walls 8, 8' and 8", wherein the liner tube 1 is closed on its lower end, thus on its rear side 10, except for drainage openings 9 (not visible), which communicate with the individual chambers 5, 5', 5" and 5'". At chamber-dependent different positions, the liner tube 1 has slit-like openings 6, 6', 6" and 6'", via which a refrigerant, which enters on its open front side 4, can be distributed across respective plate stacks 7, 7', 7" and 7'" (shown in FIG. 2). A flange section 12 embodied on the open front side 4 of the liner tube 1 is thereby designed in such a way that the refrigerant mass flow is oriented in the longitudinal direction of the individual chambers 5, 5', 5" and 5'", thus parallel to a surface of the individual secant partition walls 8, 8' and 8". As a result of corresponding shaping of the individual openings 6, 6', 6" and 6'", the guiding of the refrigerant mass flow is possible in different directions, wherein the pressure built up in the liner tube 1 pushes resulting oil through the drainage opening 9 on the otherwise closed rear side 10 of the liner tube 1. It goes without saying that these drainage openings 9 can also be arranged along the circumferential surface of the liner tube 1 in the area of its closed rear side 10. The exemplary embodiment of a liner tube 1 according to the invention shown herein is thereby produced in a cost-efficient manner as extrusion part, is particularly stable and durable.

Figure 2:
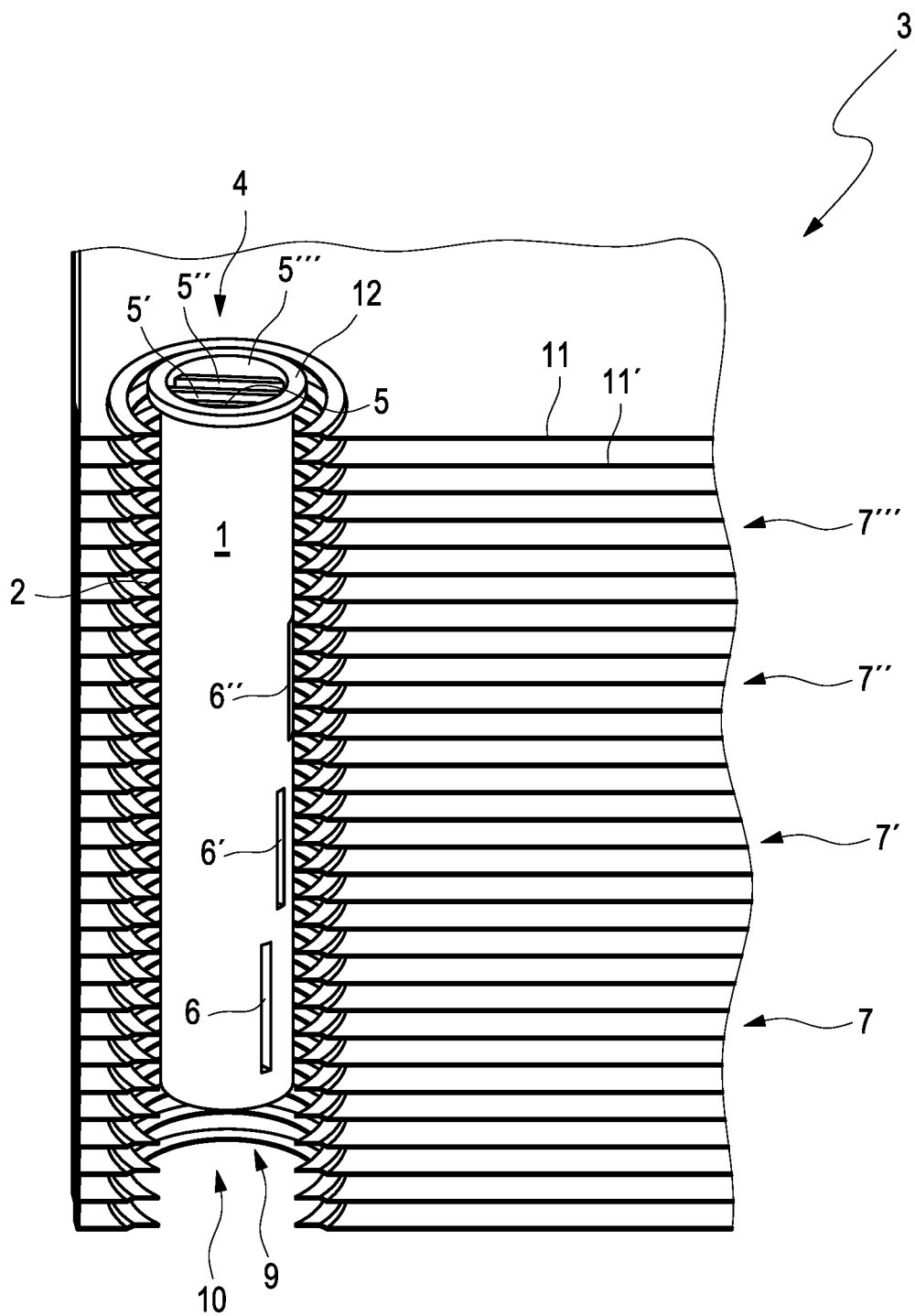
FIG. 2 shows a perspective cross sectional view of a plate heat exchanger comprising the liner tube of FIG. 1 held therein.

FIG. 2 shows a perspective cross sectional view of a plate heat exchanger 3 comprising the liner tube 1 of FIG. 1 held therein. The liner tube 1 is thereby held in an inlet channel 2 of the plate heat exchanger 3, wherein the individual openings 6, 6', 6" and 6'" are assigned to respective plate stacks 7, 7', 7" and 7'". The refrigerant mass flow, which enters on the open front side 4 of the liner tube 1, is thereby divided completely into the individual chambers 5, 5', 5" and 5'", moves downward along the longitudinal direction of the liner tube 1 in the direction of its rear end, which is closed, except for the drainage openings 9 (not visible), and escapes from the respective chamber 5, 5', 5" and 5'" at the respective positions of the openings 6, 6', 6" and 6'", and enters into the assigned plate stack 7, 7', 7" and 7'". Potentially resulting oil is pushed out of the liner tube 1 via the drainage openings 9, which communicate with the individual chambers 5, 5', 5" and 5'", or via a separate oil hole, and thus does not burden the evaporation process. This oil, which might result, would burden or impact, respectively, the evaporation process in the heat exchanger matrix. The drainage hereby has the effect that the oil circulates and finds its way back to the compressor, where it is required. If it sinks in the refrigerant distributor instead, it is useless. Thus the option of the drainage.

It goes without saying that, depending on demand, the openings 6, 6', 6" and 6''' can also be designed as individual round holes or hole rows, so as to be located exactly opposite a distance between the plates 11, 11', for example. Depending on the mounting position of the plate heat exchanger 3, the drainage openings 9 can also be arranged at suitable positions along a circumference and longitudinal direction of the liner tube 1. For the desired orientation of the refrigerant mass flow in the longitudinal direction of the chambers 5, 5', 5" and 5''', the flange section 12 of the liner tube can also be designed so as to be stretched out longer, or can be provided with a corresponding extension piece.

A plate heat exchanger 3, in the case of which the liner tube 1 ensures a distribution of the refrigerant two-phase mixture, which is less dependent on the mass flow and which is as uniform as possible, across the individual plates 11, 11', . . . and which thus has a high performance, is created in any event. Such a plate heat exchanger 3 can be used in particular in response to the cooling of electric and fuel cell vehicles.

The invention claimed is:

1. A liner tube for an inlet channel of a plate heat exchanger, comprising:
    an open front side for supplying a refrigerant mass flow;
    an at least partially closed rear side; and
    at least two bag-like chambers running in a longitudinal direction of the liner tube, each chamber communicating with the open front side and having openings at chamber-dependent different positions for distributing the refrigerant mass flow in plate stacks of the plate heat exchanger;
    wherein the openings are embodied in a slit-shaped manner; and
    wherein the at least two chambers are formed by secant partition walls running in the longitudinal direction and arranged parallel to one another.

2. The liner tube according to claim 1, wherein at least one of the chambers has at least one drainage opening for discharging oil.

3. The liner tube according to claim 2, wherein the at least one drainage opening is arranged on the rear side.

4. The liner tube according to claim 3, wherein the at least one drainage opening communicates with more than one of the chambers.

5. The liner tube according to claim 1, wherein the liner tube is made of an extrusion material.

6. The liner tube according to claim 1, wherein the rear side is pinch-sealed.

7. A plate heat exchanger comprising:
    an inlet channel;
    a plurality of plate stacks; and
    a liner tube having:
        an open front side for supplying a refrigerant mass flow;
        an at least partially closed rear side; and
        at least two bag-like chambers running in a longitudinal direction of the liner tube, each chamber communicating with the open front side and having openings at chamber-dependent different positions for distributing the refrigerant mass flow in the plate stacks;
    wherein the liner tube is arranged in the inlet channel in such a way that the openings are each oriented in a respective one of the plate stacks, and the refrigerant mass flow is a two-phase mixture; and
    wherein the at least two chambers are formed by secant partition walls running in the longitudinal direction and arranged parallel to one another.

8. The plate heat exchanger according to claim 7, wherein the inlet channel has a flange section designed to align the supplied refrigerant mass flow in the longitudinal direction.

9. The plate heat exchanger according to claim 7, wherein the plate heat exchanger is used for regulating a temperature of at least one of electric vehicles and fuel cell vehicles.

10. The plate heat exchanger according to claim 7, wherein the openings are shaped in a slit-shaped or round manner and are formed for selectively guiding a flow.

11. The plate heat exchanger according to claim 7, wherein at least one of the chambers has at least one drainage opening for discharging oil.

12. The plate heat exchanger according to claim 11, wherein the at least one drainage opening is arranged on the rear side of the liner tube.

13. The plate heat exchanger according to claim 12, wherein the at least one drainage opening communicates with more than one of the chambers.

14. The plate heat exchanger according to claim 7, wherein the liner tube is made of an extrusion material.

15. The plate heat exchanger according to claim 7, wherein the rear side of the liner tube is pinch-sealed.

16. A liner tube for an inlet channel of a plate heat exchanger, comprising:
    an open front side for supplying a refrigerant mass flow;
    an at least partially closed rear side; and
    at least two bag-like chambers running in a longitudinal direction of the liner tube, each chamber communicating with the open front side and having openings at chamber-dependent different positions for distributing the refrigerant mass flow in plate stacks of the plate heat exchanger;
    wherein at least one of the chambers has at least one drainage opening arranged on the rear side for discharging oil;
    wherein the openings are embodied in a slit-shaped manner; and
    wherein the at least two chambers are formed by secant partition walls running in the longitudinal direction and arranged parallel to one another.

17. The liner tube according to claim 16, wherein the at least one drainage opening communicates with more than one of the chambers.

* * * * *